United States Patent
Wingerter

(10) Patent No.: US 10,345,357 B2
(45) Date of Patent: Jul. 9, 2019

(54) FAULT DETECTION IN VARIABLE DIFFERENTIAL TRANSFORMER SENSORS BASED ON ZERO-CROSSINGS OF SIGNALS

(71) Applicant: The Boeing Company, Chicago, IL (US)

(72) Inventor: Richard J. Wingerter, Bridgeton, MO (US)

(73) Assignee: The Boeing Company, Chicago, IL (US)

( * ) Notice: Subject to any disclaimer, the term of this patent is extended or adjusted under 35 U.S.C. 154(b) by 244 days.

(21) Appl. No.: 15/056,837

(22) Filed: Feb. 29, 2016

(65) Prior Publication Data
US 2017/0248648 A1    Aug. 31, 2017

(51) Int. Cl.
| | | |
|---|---|---|
| *G01R 31/02* | (2006.01) | |
| *G01R 19/175* | (2006.01) | |
| *G01D 5/244* | (2006.01) | |
| *G01D 5/22* | (2006.01) | |
| *H02H 3/26* | (2006.01) | |

(52) U.S. Cl.
CPC ....... *G01R 31/027* (2013.01); *G01D 5/24457* (2013.01); *G01R 19/175* (2013.01); *G01D 5/2291* (2013.01); *H02H 3/265* (2013.01)

(58) Field of Classification Search
CPC .. G01R 31/027; G01R 19/175; G01D 5/2291; H02H 3/265
See application file for complete search history.

(56) References Cited

U.S. PATENT DOCUMENTS

| | | | | |
|---|---|---|---|---|
| 4,467,320 A | * | 8/1984 | McPhee | G01D 5/2291 318/657 |
| 5,351,692 A | * | 10/1994 | Dow | A61B 8/12 600/445 |
| 5,717,331 A | * | 2/1998 | Deller | G01D 5/2291 324/207.12 |
| 5,767,670 A | | 6/1998 | Maher et al. | |
| 5,777,468 A | | 7/1998 | Maher | |
| 5,892,645 A | * | 4/1999 | Watanabe | H02H 7/28 361/115 |
| 7,395,044 B2 | | 7/2008 | Horikawa | |
| 7,558,419 B1 | * | 7/2009 | Ye | G03F 1/84 382/144 |

(Continued)

OTHER PUBLICATIONS

"2(R) Description of Actuation Systems for Aircraft With Fly-By-Wire Flight Control Systems," Aerospace Information Report, SAE Aerospace, AIR4253, Rev. B, Issued Apr. 1989, Revised Aug. 2012, 160 pages.

*Primary Examiner* — Huy Q Phan
*Assistant Examiner* — Dustin R Dickinson
(74) *Attorney, Agent, or Firm* — Duft & Bornsen, PC

(57) ABSTRACT

Systems and methods of detecting failures in an assembly that uses a variable differential transformer sensor. In one embodiment, a signal processor receives an excitation signal applied to the sensor, and detects a zero-crossing of the excitation signal. The signal processor receives an output signal of the variable differential transformer sensor in response to the excitation signal, and detects a zero-crossing of the output signal. The signal processor detects a fault in the assembly responsive to a determination that the zero-crossing of the output signal is separated from the zero-crossing of the excitation signal by more than the detection threshold.

17 Claims, 7 Drawing Sheets

(56) References Cited

U.S. PATENT DOCUMENTS

| | | | |
|---|---|---|---|
| 2007/0146942 A1 | 6/2007 | Covington et al. | |
| 2010/0157486 A1* | 6/2010 | Parker | H02H 1/0015 361/2 |
| 2010/0213930 A1* | 8/2010 | Proksch | G01Q 10/04 324/207.18 |
| 2012/0286820 A1 | 11/2012 | Brahmavar | |
| 2012/0290238 A1 | 11/2012 | Nair et al. | |
| 2014/0156210 A1* | 6/2014 | Noll | G01D 5/2291 702/64 |
| 2014/0176336 A1* | 6/2014 | Li | G01R 31/1236 340/870.01 |
| 2014/0306719 A1 | 10/2014 | Dunsmore et al. | |
| 2014/0375331 A1* | 12/2014 | Wingerter | G01D 5/12 324/537 |
| 2015/0214829 A1* | 7/2015 | Xu | H02M 1/083 363/21.03 |

\* cited by examiner

FAULT DETECTION IN VARIABLE DIFFERENTIAL TRANSFORMER SENSORS BASED ON ZERO-CROSSINGS OF SIGNALS

FIELD

This disclosure relates to the field of displacement sensors, and more particularly, to Rotary Variable Differential Transformer (RVDT) sensors and Linear Variable Differential Transformer (LVDT) sensors.

BACKGROUND

Displacement sensors are used in a variety of applications to measure the displacement of an object. Displacement sensors may measure a linear displacement of objects, or may measure a rotary displacement of objects. One type of displacement sensor operates on the principal of a transformer, and is referred to as a Rotary or Linear Variable Differential Transformer sensor, hereinafter referenced as RVDT sensors, LVDT sensors, or collectively referenced as R/LVDT sensors.

An LVDT sensor, in one exemplary configuration, includes a primary winding that is wound around a hollow form. The LVDT sensor also includes secondary windings that are wound around the hollow form overlapping or on either side of the primary winding. As a power source applies an AC voltage to the primary winding, the magnetic flux produced by the primary winding is coupled to the secondary windings. This induces an AC voltage in each of the secondary windings. The LVDT sensor also includes a core that is able to move along a linear axis within the hollow form. The core of the LVDT sensor is attached in some manner to the object whose displacement is being measured. As the core moves within the hollow form due to movement of the object, the primary winding will be more strongly coupled to one of the secondary windings. The differential voltage across the secondary windings therefore indicates a displacement of the core in the LVDT sensor.

Displacement sensors, such as an LVDT or RVDT sensor, may be used in applications, such as aircraft, automobiles, robotics, etc. Therefore, it is desirable to identify effective ways to detecting faults in these types of sensors.

SUMMARY

One or more embodiments described herein provide systems and methods for detecting failures in four-wire or five-wire R/LVDT assemblies/applications by comparing zero-crossings of an excitation signal applied to the sensor with zero-crossings of an output signal from the sensor. When there is a failure in a sensor, wiring, or the electronic interface to the sensor, the output signal will be phase shifted in relation to the excitation signal and the zero-crossings of the excitation signal and output signal will not be aligned. However, even in a properly-functioning sensor assembly, noise on the output signal can cause the zero-crossings of the output signal to drift slightly away from the zero-crossings of the excitation signal. To distinguish between noise and a failure, a detection threshold is assigned to the sensor or the assembly that includes the sensor. A fault detector is able to compare zero-crossings of the output signal against zero-crossings of the excitation signal using the detection threshold to detect a fault in a sensor, the wiring, the electronics, etc. Because the detection threshold is used, noise on the output signal will not be misinterpreted as a fault. The detection threshold will also prevent noise from masking an actual failure.

One embodiment comprises a system configured to detect a failure in an assembly that uses a variable differential transformer sensor. The system includes a signal processor connected to an Alternating Current (AC) voltage source that provides an excitation signal to the variable differential transformer sensor, and connected to outputs of the variable differential transformer sensor. The signal processor includes a zero-crossing monitor that receives the excitation signal applied to the variable differential transformer sensor, detects a zero-crossing of the excitation signal, receives an output signal of the variable differential transformer sensor in response to the excitation signal, and detects a zero-crossing of the output signal. The signal processor also includes a fault detector that detects a fault in the assembly that uses the variable differential transformer sensor responsive to a determination that the zero-crossing of the output signal is separated from the zero-crossing of the excitation signal by more than a detection threshold.

In another embodiment, the fault detector determines that no fault is present in the assembly responsive to a determination that the zero-crossing of the output signal is separated from the zero-crossing of the excitation signal by less than the detection threshold.

In another embodiment, the fault detector provides a status of the variable differential transformer sensor or the assembly to an operator.

In another embodiment, the fault detector, responsive to detecting the fault in the assembly, generates a message that describes the fault, and transmits the message over a network to the operator for display on a device of the operator.

In another embodiment, the zero-crossing monitor detects the zero-crossing of the excitation signal and the zero-crossing of the output signal as analog waveforms. The detection threshold comprises a time window centered about the zero-crossing of the excitation signal.

In another embodiment, a zero-crossing monitor converts the excitation signal and the output signal to digital data by sampling the excitation signal and the output signal at a sampling rate. The detection threshold comprises a number of samples in relation to the zero-crossing of the excitation signal.

In another embodiment, the variable differential transformer sensor comprises a four-wire variable differential transformer sensor.

In another embodiment, the variable differential transformer sensor comprises a five-wire variable differential transformer sensor.

In another embodiment, the variable differential transformer sensor is implemented in a system of an aircraft.

In another embodiment, the signal processor further includes a threshold detector that determines the detection threshold for the variable differential transformer sensor through a test process. The test process includes detecting zero-crossings of the excitation signal and zero-crossings of the output signal during a non-failure state of the variable differential transformer sensor, determining a worst case separation between the zero-crossings of the excitation signal and the zero-crossings of the output signal during the non-failure state, detecting the zero-crossings of the excitation signal and the zero-crossings of the output signal during a failure state of the variable differential transformer sensor, determining a best case separation between the zero-crossings of the excitation signal and the zero-crossings of the output signal during the failure state, and selecting the detection threshold to be between the worst case separation and the best case separation.

Another embodiment comprises a method of detecting a failure in an assembly that uses a variable differential transformer sensor. The method includes receiving an excitation signal applied to the variable differential transformer sensor from an AC voltage source, receiving an output signal of the variable differential transformer sensor in response to the excitation signal, detecting a zero-crossing of the excitation signal, and detecting a zero-crossing of the output signal. The method further includes detecting a fault in the assembly that uses the variable differential transformer sensor responsive to a determination that the zero-crossing of the output signal is separated from the zero-crossing of the excitation signal by more than a detection threshold.

Another embodiment comprises a system having a threshold detector that uses a test process to determine a detection threshold for detecting a fault in an assembly having a variable differential transformer sensor. The threshold detector receives an excitation signal applied to the variable differential transformer sensor, and receives an output signal of the variable differential transformer sensor in response to the excitation signal. The test process includes detecting zero-crossings of the excitation signal and zero-crossings of the output signal during a non-failure state of the variable differential transformer sensor, determining a worst case separation between the zero-crossings of the excitation signal and the zero-crossings of the output signal during the non-failure state, detecting the zero-crossings of the excitation signal and the zero-crossings of the output signal during a failure state of the variable differential transformer sensor, determining a best case separation between the zero-crossings of the excitation signal and the zero-crossings of the output signal during the failure state, and selecting the detection threshold to be between the worst case separation and the best case separation.

In another embodiment, the system further includes a zero-crossing monitor that receives the excitation signal, detects a zero-crossing of the excitation signal, receives the output signal, and detects a zero-crossing of the output signal. The system further includes a fault detector that detects a fault in the assembly having the variable differential transformer sensor responsive to a determination that the zero-crossing of the output signal is separated from the zero-crossing of the excitation signal by more than the detection threshold, and determines that no fault is present in the assembly having the variable differential transformer sensor responsive to a determination that the zero-crossing of the output signal is separated from the zero-crossing of the excitation signal by less than the detection threshold.

In another embodiment, the fault detector provides a status of the variable differential transformer sensor to an operator.

The features, functions, and advantages that have been discussed can be achieved independently in various embodiments or may be combined in yet other embodiments further details of which can be seen with reference to the following description and drawings.

DESCRIPTION OF THE DRAWINGS

Some configurations of the present disclosure are now described, by way of example only, and with reference to the accompanying drawings. The same reference number represents the same element or the same type of element on all drawings.

DESCRIPTION

The figures and the following description illustrate specific exemplary embodiments of the methods and systems disclosed. It will thus be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure, and are to be construed as being without limitation. As a result, this disclosure is not limited to the specific embodiments or examples described below, but by the claims and their equivalents.

Figure 1:
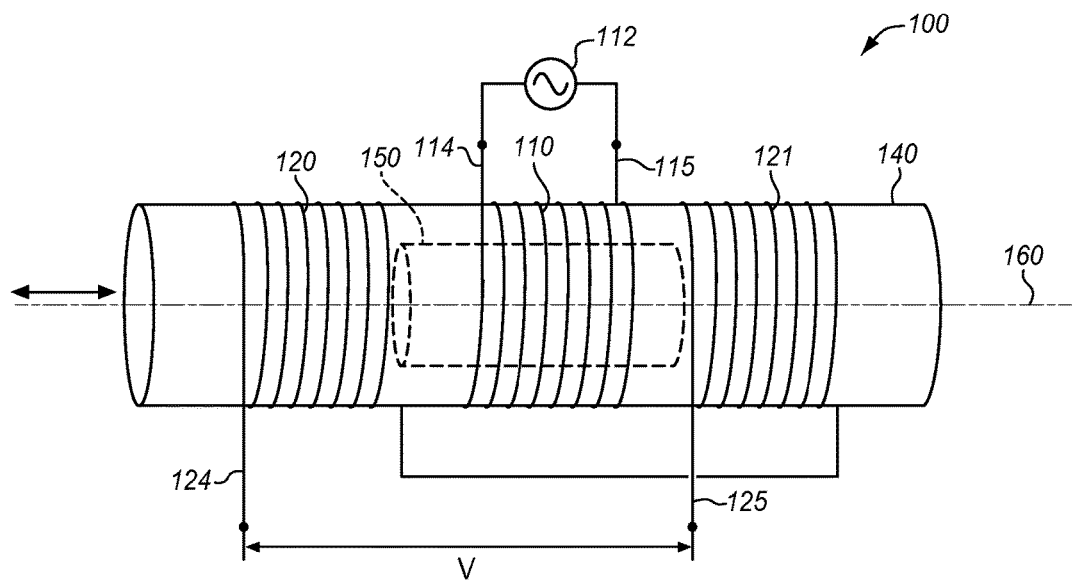
FIG. 1 illustrates a four-wire LVDT sensor.

FIG. 1 illustrates a typical four-wire LVDT sensor 100. LVDT sensor 100 includes a primary winding 110 that is wound around a hollow form 140. Primary winding 110 is connected to an AC voltage source 112 that provides an excitation signal to LVDT sensor 100. LVDT sensor 100 also includes secondary windings 120-121 that are also wound around hollow form 140 on opposing sides of primary winding 110. Secondary windings 120-121 are connected in series opposition to produce an output voltage (V), which is the difference of the voltages in each of the secondary windings 120-121. LVDT sensor 100 also includes a core 150 that is allowed to move along a linear axis 160 within hollow form 140. In use, core 150 is connected in some manner to an object (not shown), such as a component part of an aircraft, whose displacement is being measured.

To operate LVDT sensor 100, voltage source 112 connects to leads 114-115 of primary winding 110, which are considered the inputs of LVDT sensor 100. Voltage source 112 applies an excitation signal or input signal (i.e., an AC voltage) to leads 114-115, which is an analog waveform. The magnetic flux produced in primary winding 110 induces an AC voltage in each of the secondary windings 120-121. When core 150 is centered in a neutral or zero position between secondary windings 120-121, the voltage amplitude in each secondary winding 120-121 is equal. Because secondary windings 120-121 are series-opposed, the AC voltage in each secondary winding 120-121 will be 180 degrees out-of-phase. If core 150 moves to the left in FIG. 1, then the magnetic coupling between primary winding 110 and secondary winding 120 increases and the coupling between primary winding 110 and secondary winding 121 decreases. When the coupling between primary winding 110 and secondary winding 120 is stronger, the differential voltage between secondary windings 120-121 will be in-phase with the excitation signal. If core 150 moves to the right in FIG. 1, then the magnetic coupling between primary winding 110 and secondary winding 121 increases and the coupling between primary winding 110 and secondary winding 120 decreases. When the coupling between primary winding 110 and secondary winding 121 is stronger, the differential voltage between secondary windings 120-121 will be out-of-phase with the excitation signal.

A demodulation circuit (not shown) is attached to a lead 124 of secondary winding 120 and a lead 125 of secondary winding 121, which are considered the outputs of LVDT sensor 100. The output signal from sensor 100 is an AC waveform representing the differential voltage across secondary windings 120-121. The phase of the output signal indicates the displacement direction of core 150, and the amplitude of the output signal indicates the distance of the displacement.

Figure 2:
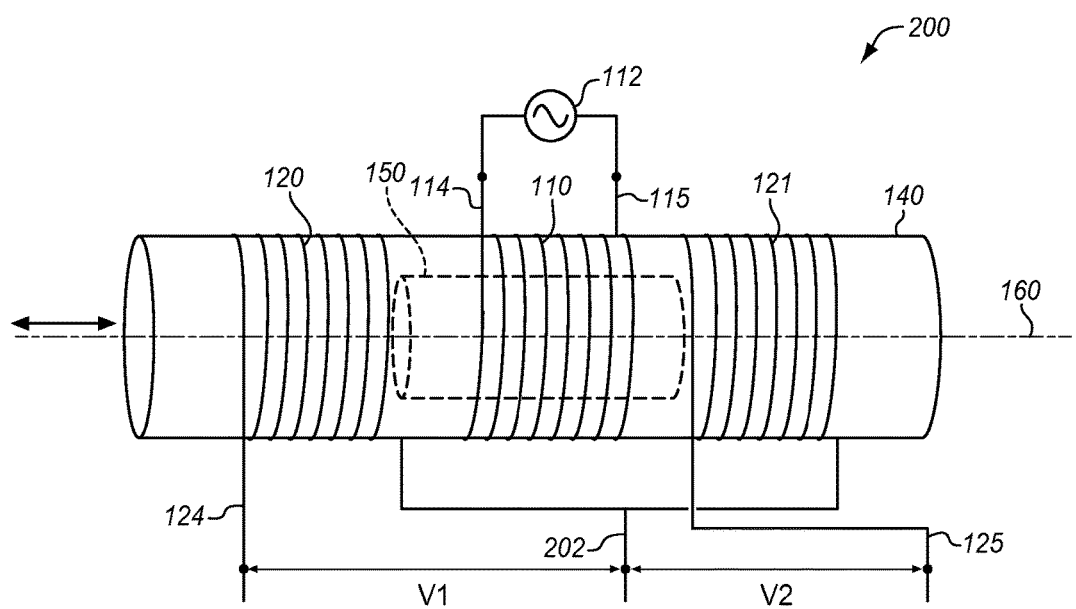
FIG. 2 illustrates a five-wire LVDT sensor.

FIG. 2 illustrates a five-wire LVDT sensor 200. Five-wire LVDT sensor 200 has a similar structure as four-wire LVDT sensor 100 as shown in FIG. 1. However, sensor 200 includes a center tap 202 between secondary windings 120-121. A demodulation circuit (not shown) is attached to a lead 124 of secondary winding 120, a lead 125 of secondary winding 121, and center tap 202. LVDT sensor 200 has two output signals: one is an output voltage (V1) measured across lead 124 of secondary winding 120 and center tap 202 (which may be attached to ground), and the other is an output voltage (V2) measured across lead 125 of secondary winding 121 and center tap 202. The differential voltage may then be calculated based on the output signals, such as (V1−V2)/(V1+V2).

The embodiments described herein provide systems and methods of detecting failures in an assembly that uses a four-wire or five-wire R/LVDT sensor, which is further described in FIGS. 3-6. When a failure is described herein, it refers to a failure in the sensor, the wiring connecting the sensor to another device, etc.

Figure 3:
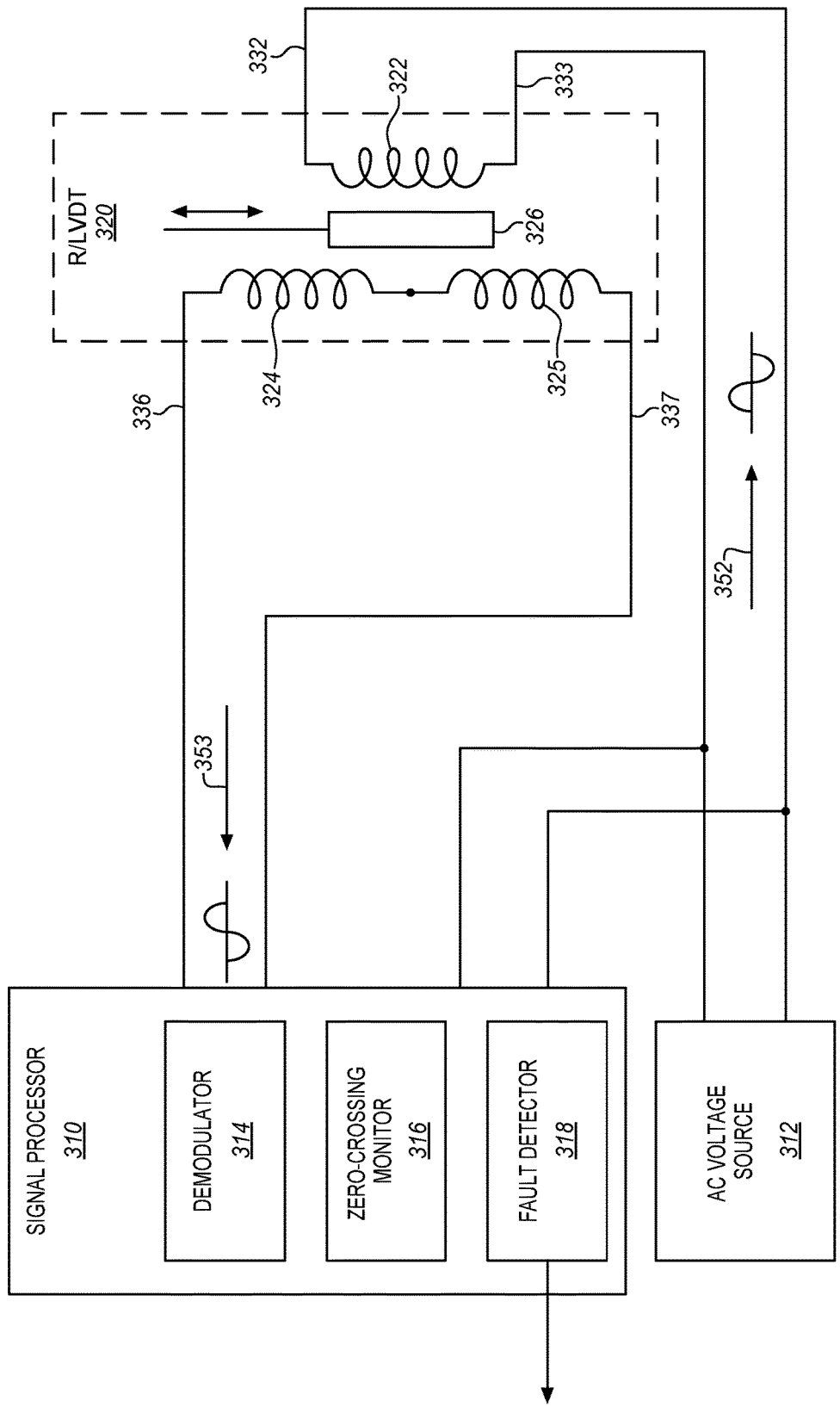
FIG. 3 is a schematic diagram of an assembly that uses a four-wire R/LVDT sensor in an exemplary embodiment.

FIG. 3 is a schematic diagram of an assembly 300 that uses a four-wire R/LVDT sensor in an exemplary embodiment. Assembly 300 includes a signal processor 310 coupled to an R/LVDT sensor 320 by wiring or cabling. Sensor 320 is illustrated schematically as having a primary winding 322 and two secondary windings 324-325. Sensor 320 also includes a core 326 that is able to move linearly along an axis as indicated by the arrow in FIG. 3 (such as for an LVDT), or revolve around an axis (such as for an RVDT). Sensor 320 includes two input leads 332-333 and two output leads 336-337, so sensor 320 is considered a "four-wire" sensor. An "assembly" refers at least to sensor 320, the wiring between sensor 320 and signal processor 310, and the components within signal processor 310.

An AC voltage source 312 is connected to inputs leads 332-333 of sensor 320. AC voltage source 312 is configured to power sensor 320 with an excitation signal 352, which is an AC waveform. Signal processor 310 includes a demodulator 314 that is connected to the outputs 336-337 of sensor 320. Demodulator 314 is a component that demodulates an output signal 353 (i.e., AC waveform) of sensor 320 to generate a DC voltage indicative of the displacement of core 326 and a direction of the displacement.

Signal processor 310 also includes a zero-crossing monitor 316 and a fault detector 318. Zero-crossing monitor 316 is connected to output leads 336-337 of sensor 320 to receive the output signal 353 from sensor 320. Zero-crossing monitor 316 is also connected to AC voltage source 312 or to input leads 332-333 of sensor 320 to receive the excitation signal 352 applied to sensor 320. Zero-crossing monitor 316 is a circuit, firmware, or component that detects, determines, or identifies zero-crossings for the excitation signal 352 and the output signal 353. A zero-crossing is a point where the sign of a mathematical function changes (e.g., from positive to negative).

Fault detector 318 is a circuit, firmware, or component that detects failures or faults in assemblies or systems that use, include, or have R/LVDT sensors by comparing zero-crossings of an excitation signal with zero-crossings of an output signal. When a 4-wire R/LVDT sensor, for example, is operating correctly, the output signal will be in-phase or out-of-phase) (180°) with the excitation signal. Therefore, the zero-crossings of the output signal should be the same as the zero-crossings of the excitation signal in an ideal case. When there is a failure in the 4-wire R/LVDT sensor, the output signal will be phase shifted in relation to the excitation signal, and the zero-crossings of the excitation signal and the output signal will not be aligned. Therefore, zero-crossing detection may be used to identify a phase shift in the output signal. However, even in a scenario where a 4-wire R/LVDT sensor is operating properly, noise on the output signal can cause one or more zero-crossings of the output signal to be slightly shifted from the zero-crossings of the excitation signal, and these shifts due to noise may be interpreted as a phase shift due to a failure.

In the embodiments described below, fault detector 318 uses a detection threshold or detection window that is defined for zero-crossing detection. The detection threshold or detection window defines an amount or difference between zero-crossings (excitation signal v. output signal) that distinguishes noise in a properly-working sensor from a phase shift due to a fault. For example, fault detector 318 may sample the excitation signal 352 and the output signal 353 to detect zero-crossings based on a sampling rate. The detection threshold may be defined as a number of samples in relation to the zero-crossings of the excitation signal 352. For instance, if the detection threshold is set at 3 samples, then fault detector 318 determines if the zero-crossings of the output signal 353 are within 3 samples of the zero-crossings of the excitation signal 352. If fault detector 318 processes the excitation signal 352 and output signal 353 as analog waveforms, then the detection threshold may comprise a time window in relation to (e.g., centered about) the zero-crossing of the excitation signal 352. There is a dramatic and repeatable difference in the separation of zero-crossings of the output signal 353 and zero-crossings of the excitation signal 352 due to noise versus the separation due to a failure. Therefore, the detection threshold may be used by fault detector 318 to distinguish noise from a fault when looking at the zero-crossings. In addition to the threshold, a persistence count may be used if the noise in the system is too significant. The persistence count allows a predetermined number of missed zero-crossings to occur before declaring a failure. Noise is typically non-periodic in these types of systems, so missed zero-crossings due to noise are not likely to happen for multiple consecutive zero-crossing windows.

Figure 4:
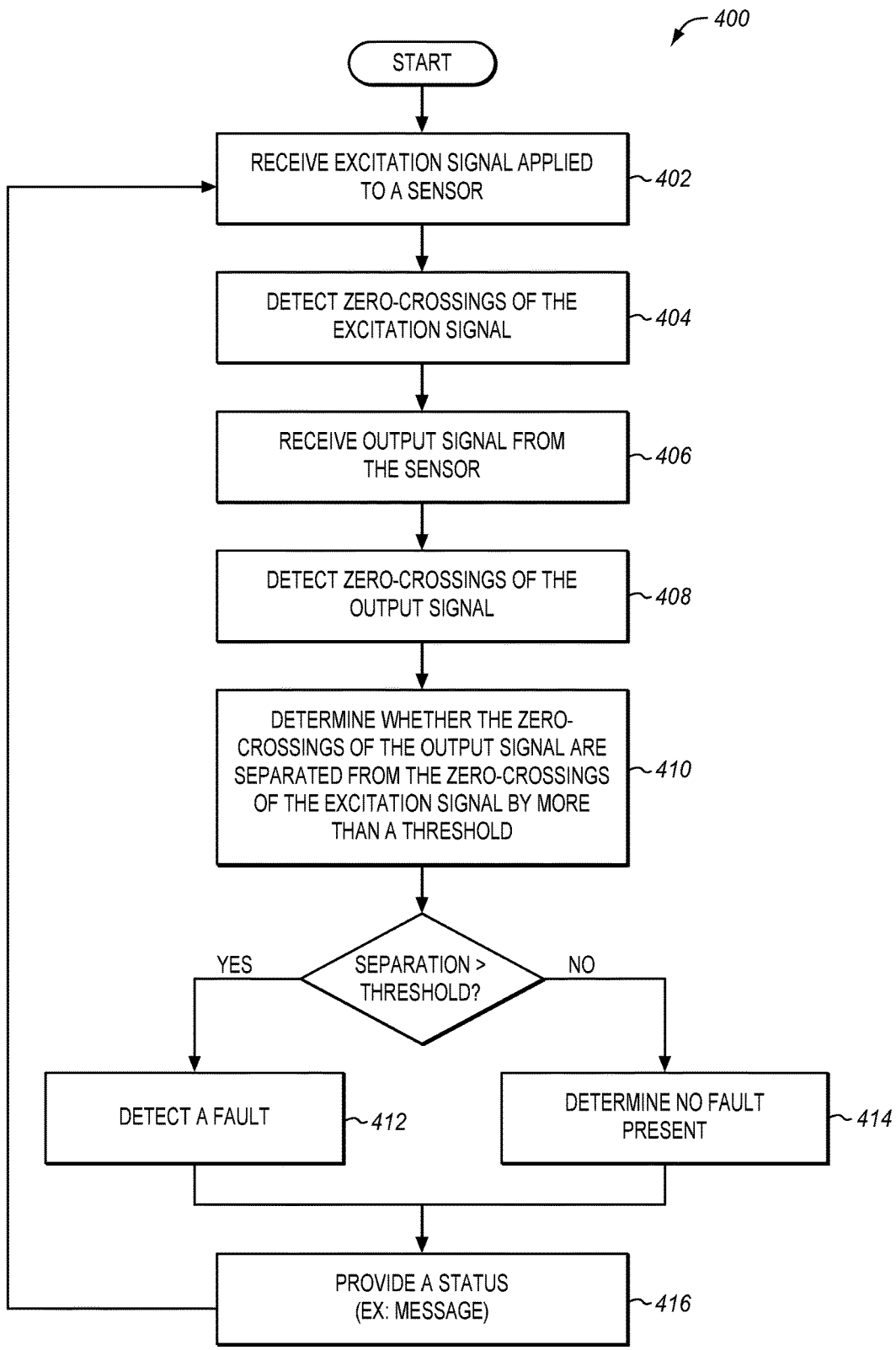
FIG. 4 is a flow chart illustrating a method of detecting a failure in an assembly having a four-wire or five-wire R/LVDT sensor in an exemplary embodiment.

FIG. 4 is a flow chart illustrating a method 400 of detecting a failure in an assembly having a four-wire or five-wire R/LVDT sensor in an exemplary embodiment. The steps of method 400 will be described with respect to signal processor 310 in FIG. 3, although one skilled in the art will understand that the methods described herein may be performed by other devices or systems not shown. The steps of the methods described herein are not all inclusive and may include other steps not shown.

Zero-crossing monitor 316 receives the excitation signal 352 applied to sensor 320 by AC voltage source 312 (step 402). Zero-crossing monitor 316 then detects, monitors, or measures one or more zero-crossings of the excitation signal 352 (step 404). Zero-crossing monitor 316 also receives the output signal 353 from sensor 320 (step 406). Zero-crossing monitor 316 then detects, monitors, or measures one or more zero-crossings of the output signal 353 (step 408). Both the excitation signal 352 and the output signal 353 are analog waveforms (sinusoidal). Zero-crossing monitor 316 may process the analog waveforms to detect the zero-crossings. Alternatively, zero-crossing monitor 316 may convert the analog waveforms to digital data by sampling the analog waveforms at a sampling rate, and process the samples to detect the zero-crossings.

Fault detector 318 determines whether the zero-crossing(s) of output signal 353 is separated from (e.g., leads or lags) the zero-crossing(s) of excitation signal 352 by more than a detection threshold (step 410). To do so, fault detector 318 identifies a set of zero-crossings for excitation signal 352. For each zero-crossing in the set, fault detector 318 identifies one or more corresponding zero-crossings for output signal 353, where the zero-crossing(s) for output signal 353 correspond with the zero-crossing for excitation signal 352 in time. Fault detector 318 then compares the zero-crossing(s) for output signal 353 to a corresponding zero-crossing for excitation signal 352 to determine whether they are separated by more than the detection threshold. For example, fault detector 318 may determine whether a zero-crossing for output signal 353 is within a time window (i.e., detection threshold) of a zero-crossing for excitation signal 352. In another example, fault detector 318 may determine whether a zero-crossing for output signal 353 is within a number of samples (i.e., detection threshold) of a zero-crossing for excitation signal 352.

If the zero-crossing(s) of output signal 353 is separated from a corresponding zero-crossing of excitation signal 352 by more than the detection threshold, then fault detector 318 detects or identifies a fault in assembly 300 (step 412). Fault detector 318 may provide the status of assembly 300 or sensor 320, such as to an operator, indicating a fault in assembly 300 or sensor 320 (step 416). For example, fault detector 318 may generate a message that describes the fault, and transmit the message over a network to the operator for display on a device of the operator. In another example, fault detector 318 may generate a user interface indicating the fault in assembly 300 or sensor 320, which may be displayed on a local or auxiliary display (e.g., a control panel in the cockpit of an aircraft). If the zero-crossing(s) of output signal 353 is separated from the corresponding zero-crossing of excitation signal 352 by less than the detection threshold, then fault detector 318 determines that there is no fault present in assembly 300 (step 414), and that the output of sensor 320 may be considered a valid output. Fault detector 318 may provide the status of assembly 300 or sensor 320 indicating that the output of sensor 320 is valid (step 416). Method 400 may continually repeat to monitor the status of assembly 300 in operation, such as when sensor 320 is used on a system of an aircraft.

Figure 5:
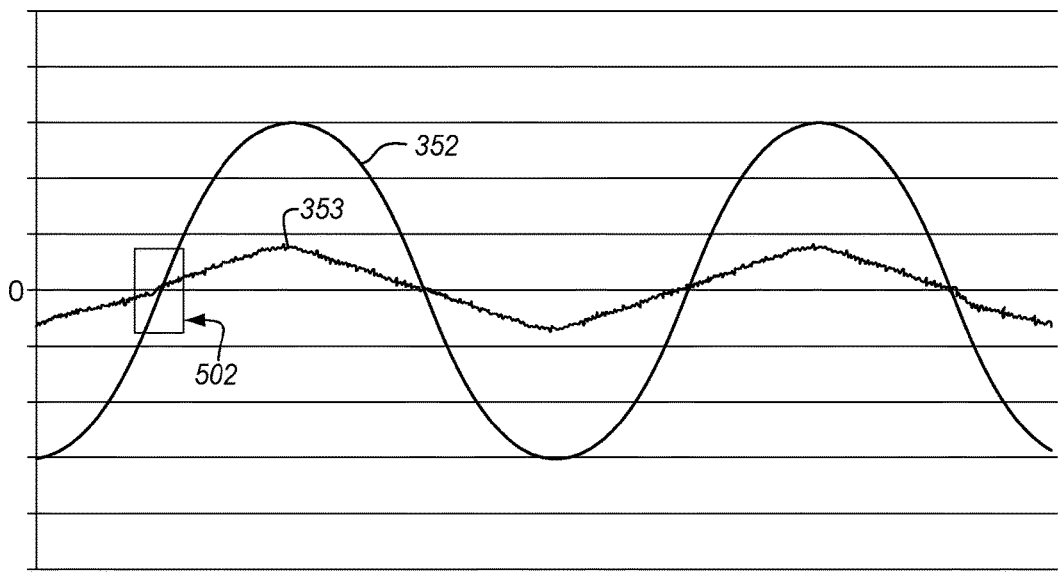
FIG. 5 illustrates waveforms for an excitation signal and an output signal in an exemplary embodiment.

FIG. 5 illustrates waveforms for excitation signal 352 and output signal 353 in an exemplary embodiment. In this view, the zero-crossings of output signal 353 appear very close to the zero-crossings of excitation signal 352. However, output signal 353 may not cross zero at the same time as excitation signal 352 due to noise causing output signal 353 to bounce around.

Figure 6:
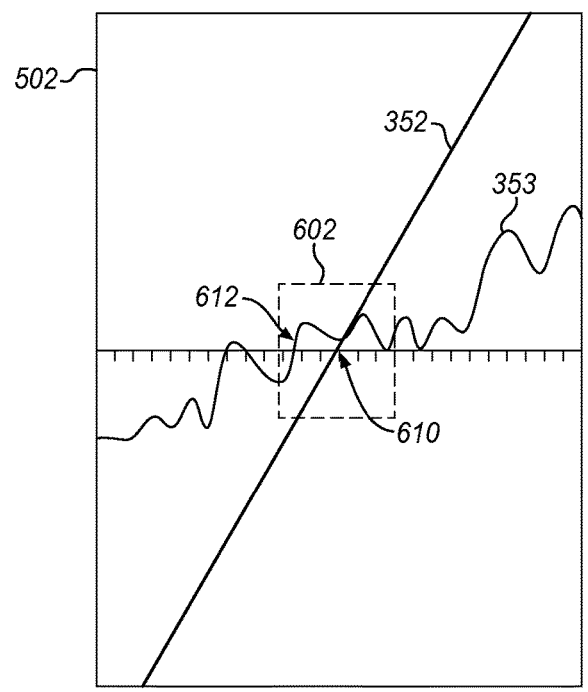
FIG. 6 is a magnified view of waveforms for an excitation signal and an output signal in an exemplary embodiment.

FIG. 6 is a magnified view 502 of the waveforms for excitation signal 352 and output signal 353 in an exemplary embodiment. In this magnified view 502, a zero-crossing 610 of excitation signal 352 and a zero-crossing 612 of output signal 353 are more visible. As is evident, output signal 353 does not cross zero at the same time as excitation signal 352 in this example. Although output signal 353 does not cross zero at the same time as excitation signal 352, sensor 320 may be operating correctly as noise may be the cause of the difference between the zero-crossings. To distinguish noise from failures, fault detector 318 uses a detection threshold 602 when comparing zero-crossing 612 of output signal 353 with zero-crossing 610 of excitation signal 352. In FIG. 6, although zero-crossing 612 of output signal 353 is not aligned with zero-crossing 610 of excitation signal 352, it is within detection threshold 602. Therefore, fault detector 318 determines that there is no fault with assembly 300 or sensor 320. There may be multiple zero-crossings of output signal 353 that are proximate to zero-crossing 610 of excitation signal 352, and fault detector 318 determines whether at least one zero-crossings of output signal 353 is within detection threshold 602. When there are no zero-crossings of output signal 353 within detection threshold 602, fault detector 318 is able to determine that a phase shift has occurred in output signal 353 due to a fault.

Figure 7:
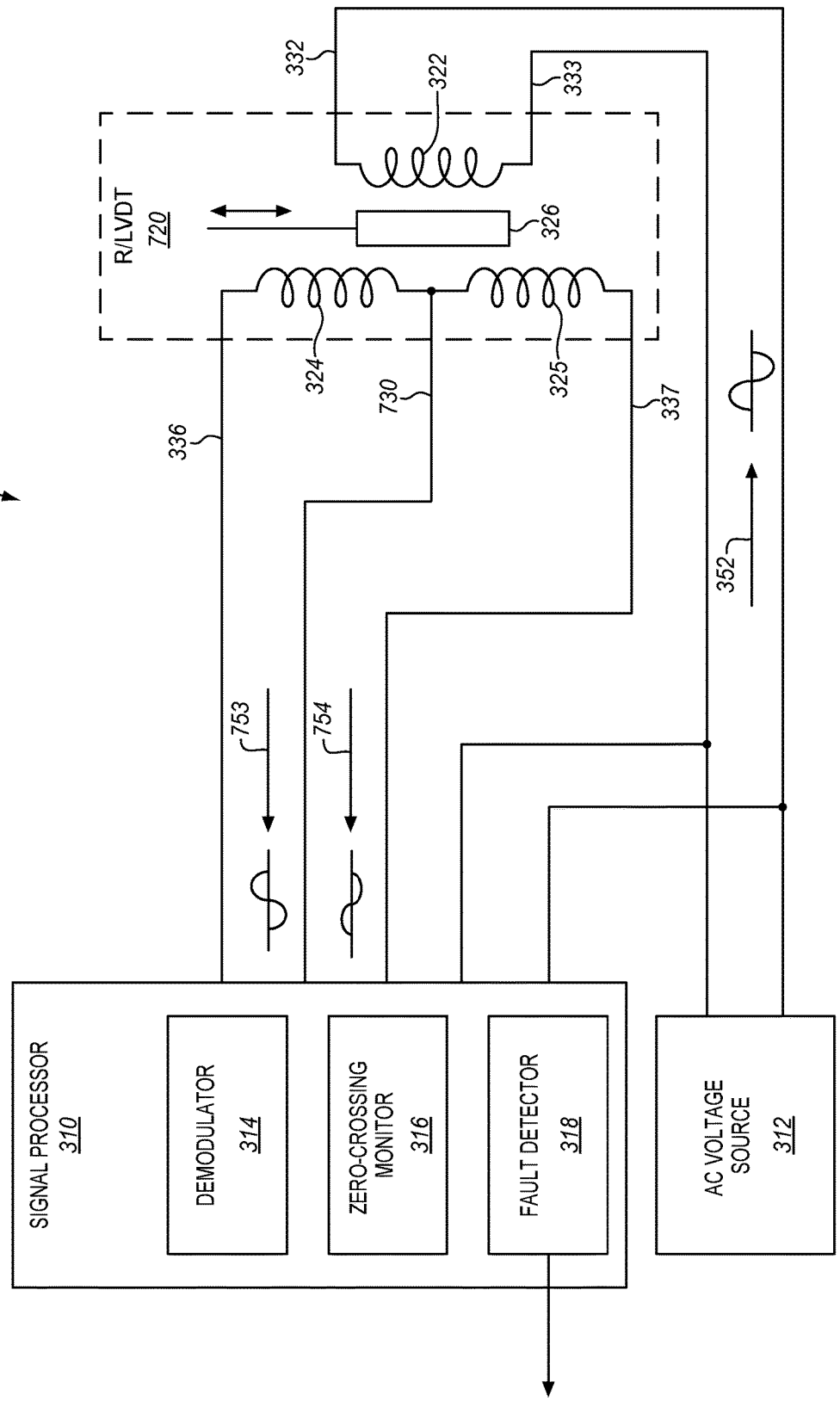
FIG. 7 is a schematic diagram of an assembly that uses a five-wire R/LVDT sensor in an exemplary embodiment.

The above example was for a 4-wire R/LVDT, but method 400 may apply also to a 5-wire R/LVDT sensor. FIG. 7 is a schematic diagram of an assembly 700 that uses a five-wire R/LVDT sensor 720 in an exemplary embodiment. Sensor 720 is similar to sensor 320 in FIG. 3, except that sensor 720 includes three output leads 336-337 and 730 (which is the center tap). Because sensor 720 has two inputs leads 332-333 and three output leads 336-337 and 730, it is considered a "five-wire" sensor. A 5-wire R/LVDT sensor 720 has two output signals 753-754; one output signal 753 represents a voltage across output lead 336 and output lead 730, and the other output signal 754 represents a voltage across output lead 337 and output lead 730. Method 400 may be performed in a similar manner with 5-wire R/LVDT sensor 720 to detect faults.

Figure 8:
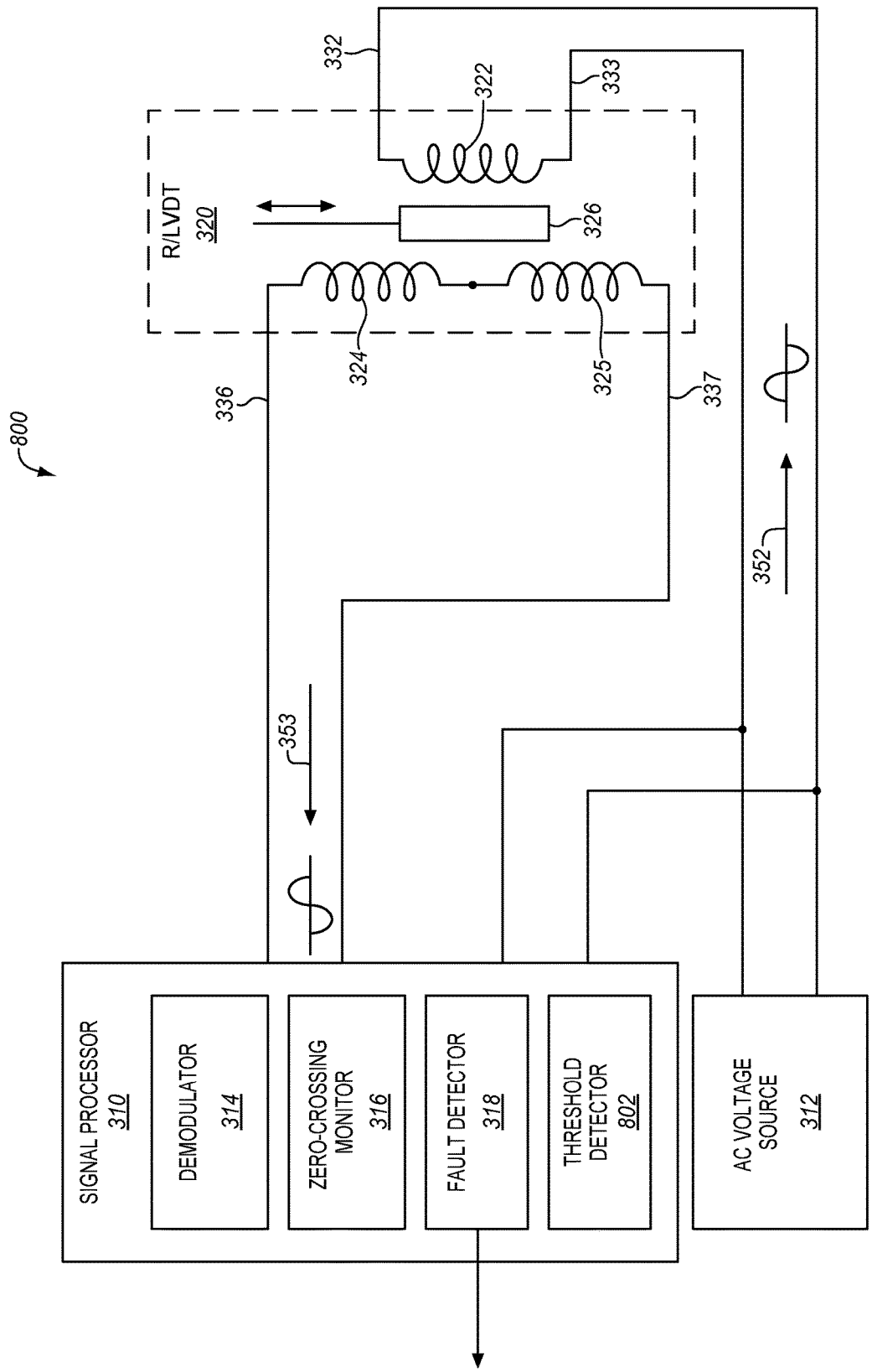
FIG. 8 is a schematic diagram illustrating a threshold detector in a signal processor in an exemplary embodiment.

The detection threshold used by fault detector 318 may depend on a number of factors. For one, the detection threshold may be sensor-specific or may be specific to a type of sensor. Another factor may be a sampling rate used to decode the excitation signal and output signal. Another factor may be expected noise on the output signal due to electronics and cable/sensor capacitance. Therefore, signal processor 310 may further include a threshold detector that is able to determine the detection threshold for a sensor or type of sensor. FIG. 8 is a schematic diagram illustrating a threshold detector 802 in signal processor 310 in an exemplary embodiment. Threshold detector 802 is a circuit, firmware, or component that determines or calculates a detection threshold for a sensor. Although threshold detector 802 is shown as part of signal processor 310, it may be a separate component in other embodiments.

Figure 9:
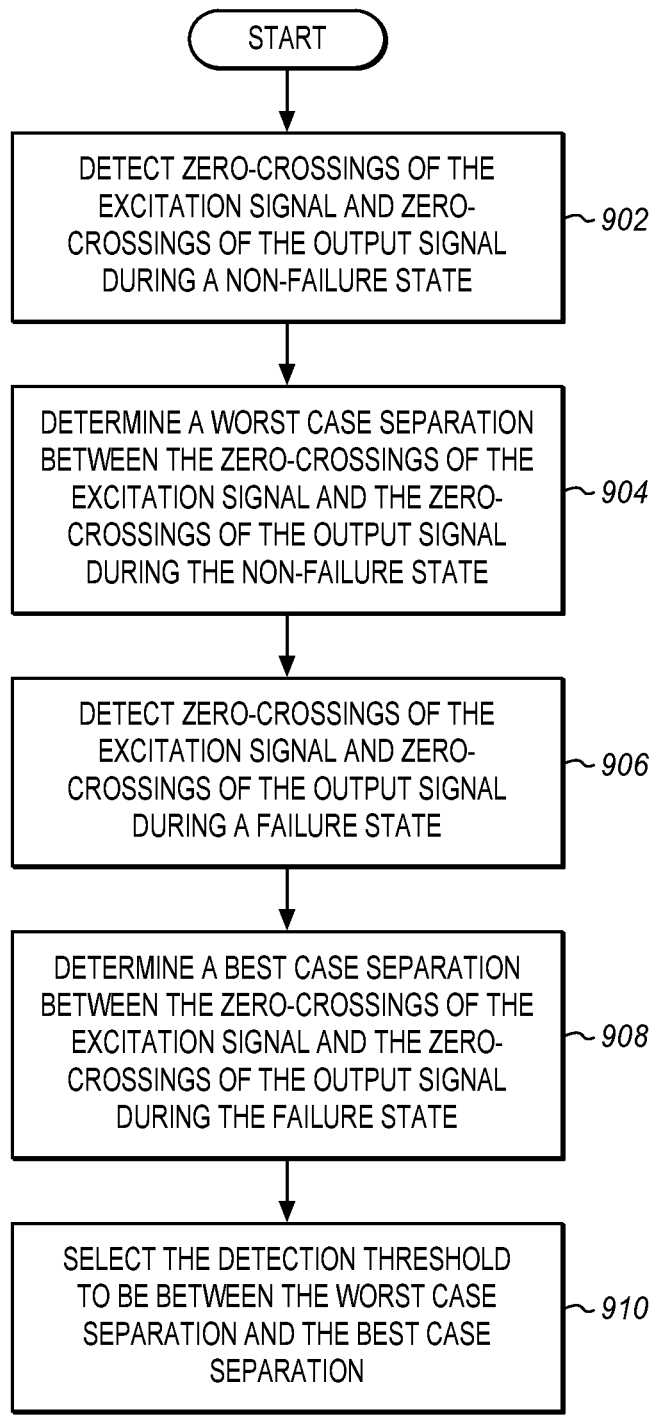
FIG. 9 is a flow chart illustrating a test process used to determine a detection threshold for a sensor in an exemplary embodiment.

Threshold detector 802 may determine the detection threshold for a sensor (e.g., sensor 320) through a test process. Testing is able to show a dramatic and repeatable difference in the separation of zero-crossings of the output signal and zero-crossings of the excitation signal due noise versus the separation due to a failure. FIG. 9 is a flow chart illustrating a test process 900 (i.e., method) used to determine a detection threshold for a sensor in an exemplary embodiment. The steps of process 900 will be described with respect to system 800 in FIG. 8, although one skilled in the art will understand that the methods or processes described herein may be performed by other devices or systems not shown.

For test process 900, threshold detector 802 is connected to a sensor under test, such as sensor 320 in FIG. 8. AC voltage source 312 applies excitation signal 352 to sensor 320, which results in output signal 353. The core of 326 of sensor 320 is moved through the full range of displacement during the test process to ensure all output signals are covered for the test. Threshold detector 802 detects, monitors, or measures zero-crossings of excitation signal 352 and zero-crossings of output signal 353 during a non-failure state of sensor 320 (step 902). A non-failure state is when it is assumed or known that sensor 320 is operating normally. Threshold detector 802 determines a worst case separation between the zero-crossings of excitation signal 352 and the zero-crossings of output signal 353 during the non-failure state (step 904). The worst case separation is the largest separation in time or number of samples between zero-crossings of excitation signal 352 and zero-crossings of output signal 353 during a non-failure state. For example, the worst case separation may be 3 samples between a zero-crossing of excitation signal 352 and a zero-crossing of output signal 353.

Threshold detector 802 also monitors the zero-crossings of excitation signal 352 and the zero-crossings of output signal 353 during a failure state of sensor 320 (step 906). An operator may create a failure state of sensor 320 by disconnecting one of the inputs from AC voltage source 312, disconnecting one of the outputs of sensor 320, etc. An operator may also replace sensor 320 with the same type of sensor that is known to have a fault. Threshold detector 802 determines a best case separation between the zero-crossings of excitation signal 352 and the zero-crossings of output signal 353 during the failure state (step 908). The best case separation is the smallest separation in time or number of samples between zero-crossings of excitation signal 352 and zero-crossings of output signal 353 during a failure state. For example, the best case separation may be 7 samples between a zero-crossing of excitation signal 352 and a zero-crossing of output signal 353. Threshold detector 802 then selects the detection threshold to be between the worst case separation and the best case separation (step 910). For example, if the worst case separation during a non-failure state is 3 samples and the best case separation during a failure state is 7 samples, then the threshold detector 802 may select the detection threshold to be at 5 samples.

Process 900 may be repeated for any number of sensors or types of sensors that will be used in a system. The detection threshold determined for those sensors will then be saved by fault detector 318 for use in fault detection.

Any of the various components shown in the figures or described herein may be implemented as hardware, software, firmware, or some combination of these. For example, a component may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, a component may be implemented as instructions executable by a processor or a computer to perform the functions of the component. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific configurations were described herein, the scope is not limited to those specific configurations. Rather, the scope is defined by the following claims and any equivalents thereof.

The invention claimed is:

1. A system configured to detect a failure in an assembly (300, 700) that uses a variable differential transformer sensor (320, 720), the system comprising:
   a signal processor (310) connected to an Alternating Current "AC" voltage source (312) that provides an excitation signal (352) to the variable differential transformer sensor, and connected to outputs (336-337) of the variable differential transformer sensor, the signal processor comprising:
     a zero-crossing monitor (316) comprising a circuit that receives (402) the excitation signal applied to the variable differential transformer sensor, detects (404) zero-crossings of the excitation signal, receives (406) an output signal (353) of the variable differential transformer sensor in response to the excitation signal, and detects (408) zero-crossings of the output signal; and
     a fault detector (318) comprising a circuit that uses a detection threshold assigned to the variable differential transformer sensor to compare the zero-crossings of the output signal with the zero-crossings of the excitation signal, wherein the detection threshold defines a difference in separation between the zero-crossings of the output signal and the zero-crossings of the excitation signal that distinguishes noise in the variable differential transformer sensor from a fault in the variable differential transformer sensor;
     for a zero-crossing of the excitation signal, the circuit of the fault detector determines whether the zero-crossings of the output signal are separated from the zero-crossing of the excitation signal by more than the detection threshold, detects (412) the fault in the assembly that uses the variable differential transformer sensor responsive to a determination that the zero-crossings of the output signal are separated from the zero-crossing of the excitation signal by more than the detection threshold, distinguishes noise from a fault in the assembly that uses the variable differential transformer sensor responsive to a determination that at least one of the zero-crossings of the output signal is separated from the zero-crossing of the excitation signal by less than the detection threshold, and provides a status of the assembly.

2. The system of claim 1 wherein:
   the fault detector provides the status to an operator indicating output of the variable differential transformer sensor is valid responsive to the determination that the at least one of the zero-crossings of the output signal is separated from the zero-crossing of the excitation signal by less than the detection threshold.

3. The system of claim 1 wherein:
the fault detector provides the status of the variable differential transformer sensor to an operator indicating the fault responsive to the determination that the zero-crossings of the output signal are separated from the zero-crossing of the excitation signal by more than the detection threshold for a predetermined number of the zero-crossings of the excitation signal.

4. The system of claim 3 wherein:
the fault detector, responsive to detecting the fault in the assembly that uses the variable differential transformer sensor, generates (416) a message that describes the fault, and transmits the message over a network to the operator for display on a device of the operator.

5. The system of claim 1 wherein:
the zero-crossing monitor detects the zero-crossings of the excitation signal and the zero-crossings of the output signal as analog waveforms; and
the detection threshold comprises a time window (602) centered about the zero-crossing of the excitation signal.

6. The system of claim 1 wherein:
the zero-crossing monitor converts the excitation signal and the output signal to digital data by sampling the excitation signal and the output signal at a sampling rate; and
the detection threshold comprises a number of samples in relation to the zero-crossing of the excitation signal.

7. The system of claim 1 wherein:
the variable differential transformer sensor comprises a four-wire variable differential transformer sensor (320).

8. The system of claim 1 wherein:
the variable differential transformer sensor comprises a five-wire variable differential transformer sensor (720).

9. The system of claim 1 wherein:
the variable differential transformer sensor is implemented in a system of an aircraft.

10. The system of claim 1 wherein:
the signal processor further includes:
a threshold detector (802) comprising a circuit that determines the detection threshold for the variable differential transformer sensor through a test process (900);
the test process includes:
detecting (902) the zero-crossings of the excitation signal and the zero-crossings of the output signal during a non-failure state of the variable differential transformer sensor;
determining (904) a worst case separation between the zero-crossings of the excitation signal and the zero-crossings of the output signal during the non-failure state;
detecting (906) the zero-crossings of the excitation signal and the zero-crossings of the output signal during a failure state of the variable differential transformer sensor;
determining (908) a best case separation between the zero-crossings of the excitation signal and the zero-crossings of the output signal during the failure state; and
selecting (910) the detection threshold to be between the worst case separation and the best case separation.

11. A method (400) of detecting a failure in an assembly that uses a variable differential transformer sensor, the method comprising:
receiving (402), in a signal processor, an excitation signal applied to the variable differential transformer sensor from an Alternating Current "AC" voltage source;
receiving (406), in the signal processor, an output signal of the variable differential transformer sensor in response to the excitation signal;
detecting (404), at the signal processor, zero-crossings of the excitation signal;
detecting (408), at the signal processor, zero-crossings of the output signal;
for a zero-crossing of the excitation signal, the method comprises:
determining (410), at the signal processor, whether the zero-crossings of the output signal are separated from the zero-crossing of the excitation signal by more than a detection threshold, wherein the detection threshold is assigned to the variable differential transformer sensor and defines a difference in separation between the zero-crossings of the output signal and the zero-crossings of the excitation signal that distinguishes noise in the variable differential transformer sensor from a fault in the variable differential transformer sensor;
detecting (412), at the signal processor, the fault in the assembly that uses the variable differential transformer sensor responsive to a determination (410) that the zero-crossings of the output signal are separated from the zero-crossing of the excitation signal by more than the detection threshold;
distinguishing, at the signal processor, noise from a fault in the assembly that uses the variable differential transformer sensor responsive to a determination that at least one of the zero-crossings of the output signal is separated from the zero-crossing of the excitation signal by less than the detection threshold; and
providing, at the signal processor, a status of the assembly.

12. The method of claim 11 wherein providing a status comprises:
providing the status to an operator indicating output of the variable differential transformer sensor is valid responsive to the determination that the at least one of the zero-crossings of the output signal is separated from the zero-crossing of the excitation signal by less than the detection threshold.

13. The method of claim 11 wherein providing a status comprises:
providing the status of the variable differential transformer sensor to an operator indicating the fault responsive to the determination that the zero-crossings of the output signal are separated from the zero-crossing of the excitation signal by more than the detection threshold for a predetermined number of the zero-crossings of the excitation signal.

14. The method of claim 13 wherein providing the status comprises:
generating (416) a message, responsive to detecting the fault in the assembly that uses the variable differential transformer sensor, that describes the fault; and
transmitting the message over a network to the operator for display on a device of the operator.

15. The method of claim 11 wherein:

detecting the zero-crossings of the excitation signal and the zero-crossings of the output signal are performed on analog waveforms; and the detection threshold comprises a time window centered about the zero-crossing of the excitation signal.

16. The method of claim 11 wherein:

detecting the zero-crossings of the excitation signal and the zero-crossings of the output signal are performed by converting the excitation signal and the output signal to digital data by sampling the excitation signal and the output signal at a sampling rate; and the detection threshold comprises a number of samples in relation to the zero-crossing of the excitation signal.

17. The method of claim 11 further comprising:

determining the detection threshold for the variable differential transformer sensor through a test process (900);

wherein the test process includes:

detecting (902) the zero-crossings of the excitation signal and the zero-crossings of the output signal during a non-failure state of the variable differential transformer sensor;

determining (904) a worst case separation between the zero-crossings of the excitation signal and the zero-crossings of the output signal during the non-failure state;

detecting (906) the zero-crossings of the excitation signal and the zero-crossings of the output signal during a failure state of the variable differential transformer sensor;

determining (908) a best case separation between the zero-crossings of the excitation signal and the zero-crossings of the output signal during the failure state; and selecting (910) the detection threshold to be between the worst case separation and the best case separation.

\* \* \* \* \*